US012431429B2

(12) United States Patent
Matsumoto et al.

(10) Patent No.: US 12,431,429 B2
(45) Date of Patent: Sep. 30, 2025

(54) SEMICONDUCTOR DEVICE HAVING PLURAL MEMORY CELL MATS AND MULTIPLE VOLTAGE LINES

(71) Applicant: MICRON TECHNOLOGY, INC., Boise, ID (US)

(72) Inventors: Hirokazu Matsumoto, Hachioji (JP); Makoto Sato, Sagamihara (JP); Ryota Suzuki, Sagamihara (JP); Kyoka Egami, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 762 days.

(21) Appl. No.: 17/579,501

(22) Filed: Jan. 19, 2022

(65) Prior Publication Data

US 2023/0230922 A1 Jul. 20, 2023

(51) Int. Cl.
*H01L 23/528* (2006.01)
*H10B 12/00* (2023.01)

(52) U.S. Cl.
CPC .......... *H01L 23/5286* (2013.01); *H10B 12/00* (2023.02)

(58) Field of Classification Search
CPC ..... G11C 5/063; G11C 5/025; G11C 11/4074; G11C 7/18; H01L 23/5286; H10B 12/00; H10B 12/50
See application file for complete search history.

(56) References Cited

U.S. PATENT DOCUMENTS

| 7,474,550 | B2* | 1/2009 | Fujisawa | H10B 12/48 365/230.03 |
| 7,808,804 | B2* | 10/2010 | Kwon | G11C 5/063 365/51 |
| 9,552,866 | B2* | 1/2017 | Mochida | G11C 11/4085 |
| 11,100,988 | B2* | 8/2021 | Inaba | G11C 5/025 |
| 2006/0181955 | A1* | 8/2006 | Shinozaki | G11C 8/08 365/230.06 |
| 2018/0308917 | A1* | 10/2018 | Cheng | H10D 86/443 |
| 2019/0057726 | A1* | 2/2019 | Nishizaki | G11C 7/12 |
| 2021/0012828 | A1* | 1/2021 | Kim | H01L 28/86 |

* cited by examiner

*Primary Examiner* — Khiem D Nguyen
(74) *Attorney, Agent, or Firm* — Dorsey & Whitney LLP

(57) ABSTRACT

Disclosed herein is an apparatus that includes: a memory cell array including a plurality of first memory cell mats arranged in a first direction; a first voltage line supplied with a first voltage, the first voltage line extending in the first direction and being connected to a plurality of first vias each arranged over a corresponding one of even numbered ones of the plurality of first memory cell mats; and a second voltage line supplied with a second voltage different from the first voltage, the second voltage line extending in the first direction and being connected to a plurality of second vias each arranged over a corresponding one of odd numbered ones of the plurality of first memory cell mats.

19 Claims, 6 Drawing Sheets

SEMICONDUCTOR DEVICE HAVING PLURAL MEMORY CELL MATS AND MULTIPLE VOLTAGE LINES

BACKGROUND

Some semiconductor memory devices such as a DRAM (Dynamic Random Access Memory) include a memory cell array divided into a plurality of memory cell mats. A plurality of operating voltages are supplied to each of the memory cell mats. To supply the operating voltages to each of the memory cell mats with a lower resistance, it is necessary to use lines of upper layers having a large line width and use via-conductors having a large diameter. However, since lower wiring layers are high in line density, it is sometimes difficult to form a plurality of connecting portions to the via-conductors having a large diameter on the lower wiring layers.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
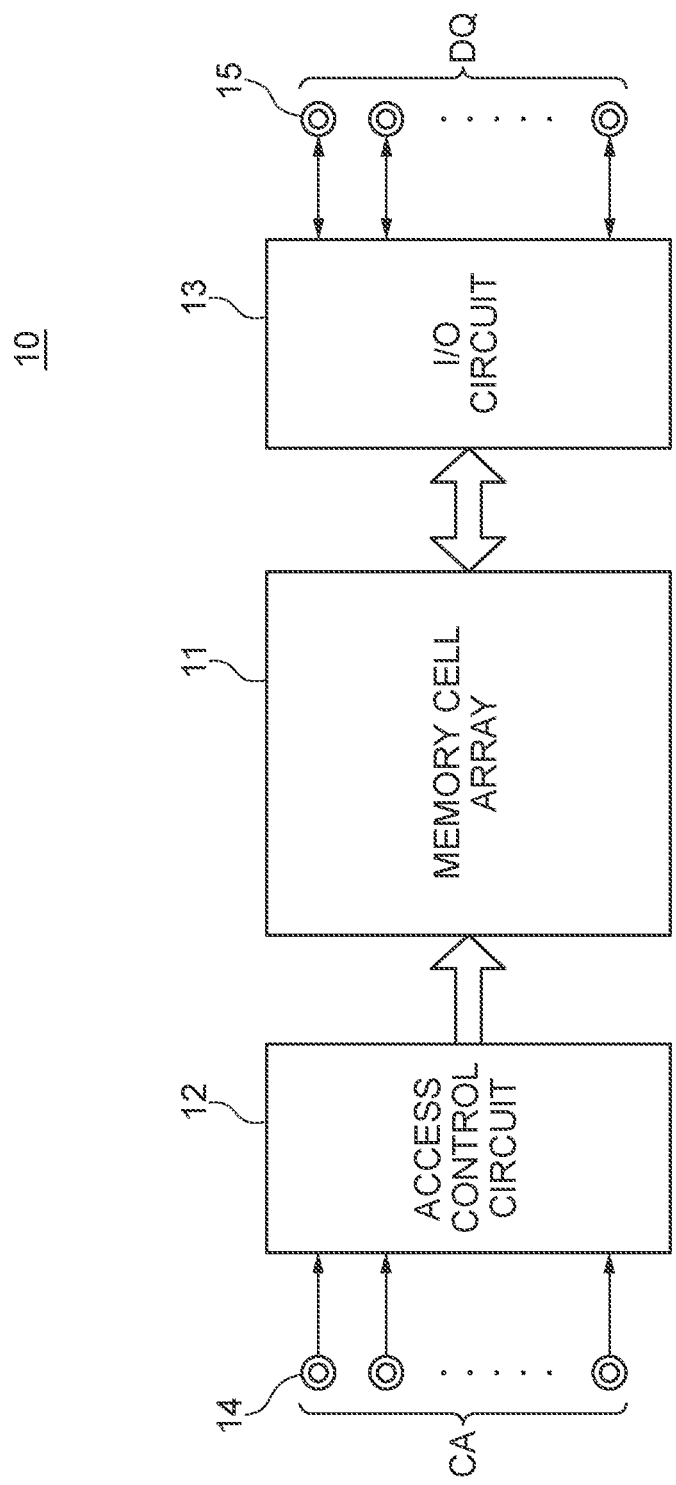
FIG. 1 is a block diagram showing a configuration of a semiconductor device according to the present disclosure.

FIG. 1 is a block diagram showing a configuration of a semiconductor device 10 according to the present disclosure. The semiconductor device 10 shown in FIG. 1 is, for example, a DRAM and includes a memory cell array 11, an access control circuit 12 that performs an access to the memory cell array 11, and an I/O circuit 13 that performs input/output of data to/from the memory cell array 11. The access control circuit 12 performs an access to the memory cell array 11 on the basis of a command address signal CA input from an external controller through a command address terminal 14.

At the time of a read operation, data DQ read from the memory cell array 11 is output to a data I/O terminal 15 via the I/O circuit 13. At the time of a write operation, data DQ input from an external controller to the data I/O terminal 15 is written to the memory cell array 11 via the I/O circuit 13.

Figure 2:
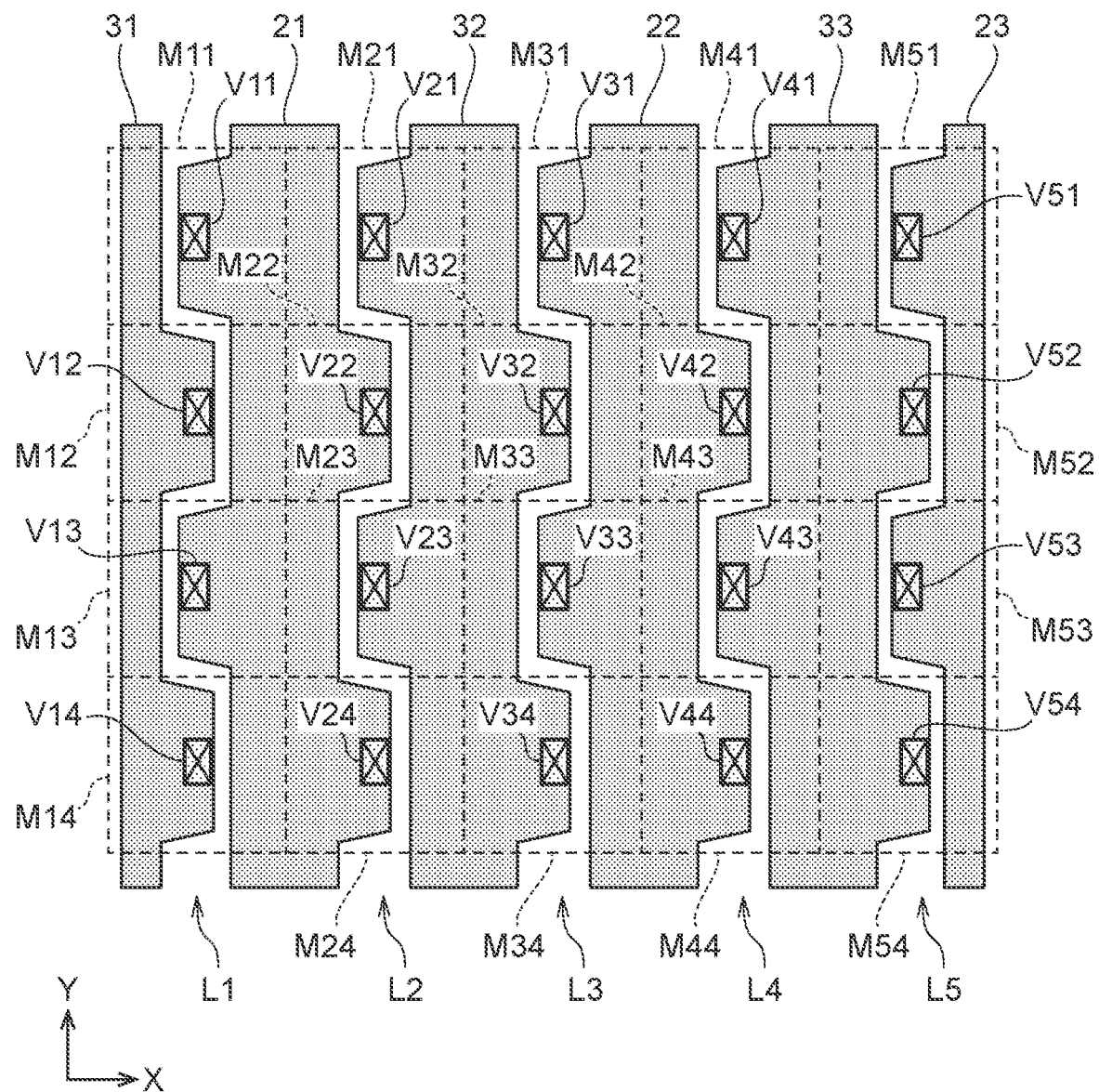
FIG. 2 is a plan view for explaining a layout of memory cell mats included in a memory cell array.

FIG. 2 is a plan view for explaining a layout of memory cell mats included in the memory cell array 11. As shown in FIG. 2, the memory cell array 11 includes a plurality of memory cell mats laid out in a matrix. FIG. 2 shows a memory mat line L1 including memory cell mats M11 to M14 arranged in a Y direction, a memory mat line L2 including memory cell mats M21 to M24 arranged in the Y direction, a memory mat line L3 including memory cell mats M31 to M34 arranged in the Y direction, a memory mat line L4 including memory cell mats M41 to M44 arranged in the Y direction, and a memory mat line L5 including memory cell mats M51 to M54 arranged in the Y direction. The memory cell mats M11, M21, M31, M41, and M51 are arranged in an X direction. The memory cell mats M12, M22, M32, M42, and M52 are arranged in the X direction. The memory cell mats M13, M23, M33, M43, and M53 are arranged in the X direction. The memory cell mats M14, M24, M34, M44, and M54 are arranged in the X direction.

Figure 3:
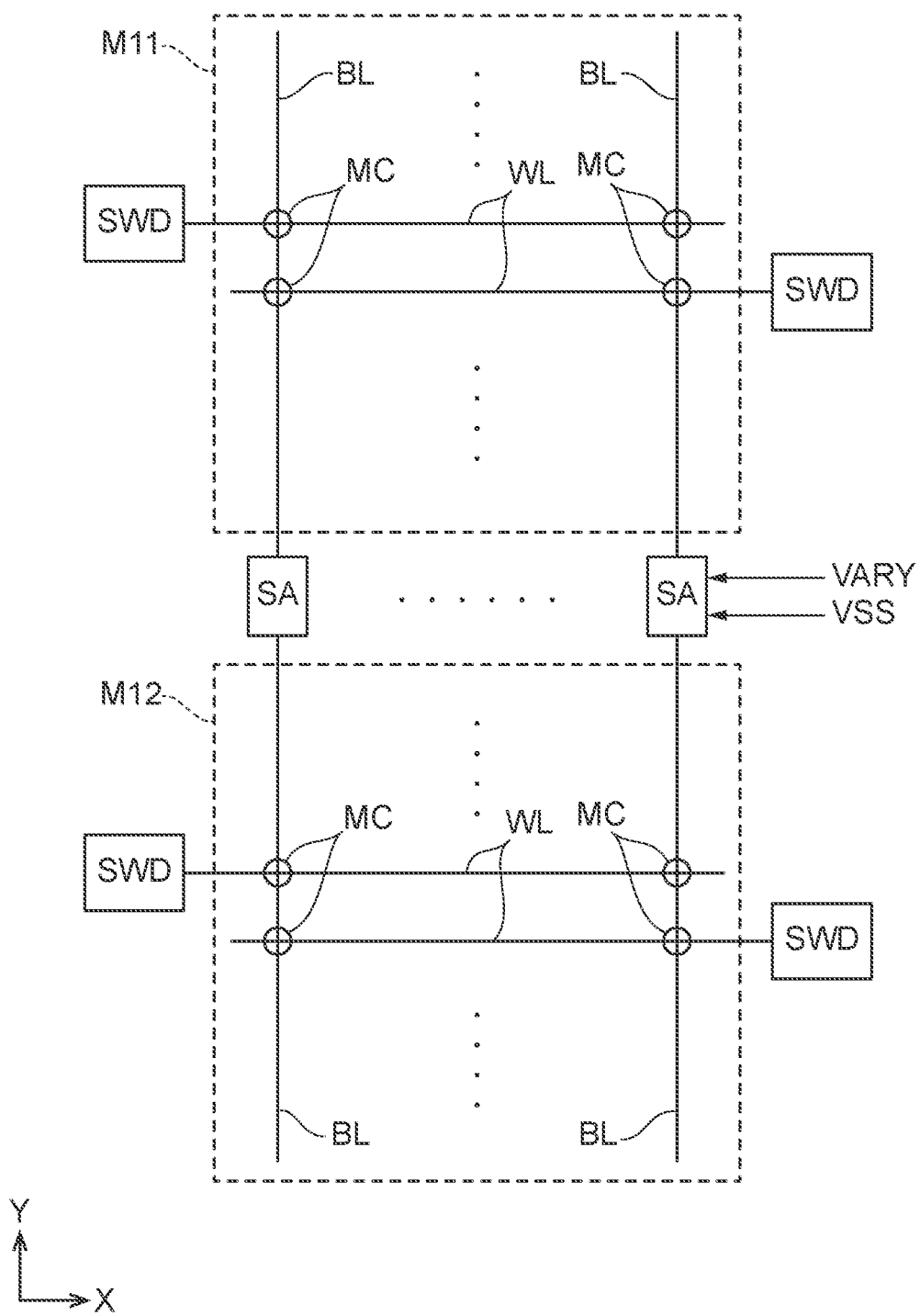
FIG. 3 is a circuit diagram for explaining a configuration of the memory cell mats.

FIG. 3 is a circuit diagram for explaining a configuration of the memory cell mats. FIG. 3 shows the memory cell mat M11 and the memory cell mat M12 adjacent in the Y direction. Each of the memory cell mats M11 and M12 includes a plurality of sub-word lines WL extending in the X direction and a plurality of bit lines BL extending in the Y direction, and memory cells MC are placed at intersections therebetween, respectively. The sub-word lines WL are respectively driven by corresponding sub-word drivers SWD. Each pair of bit lines BL is coupled to a corresponding one of sense amplifiers SA. When the sense amplifiers SA are activated, ones of the corresponding pairs of the bit lines BL are driven to an array potential VARY and the others of the pairs of the bit lines BL are driven to a ground potential VSS. The array potential VARY and the ground potential VSS are supplied to the sense amplifiers SA via low-resistance iRDLs (inline redistribution layers).

Figure 4:
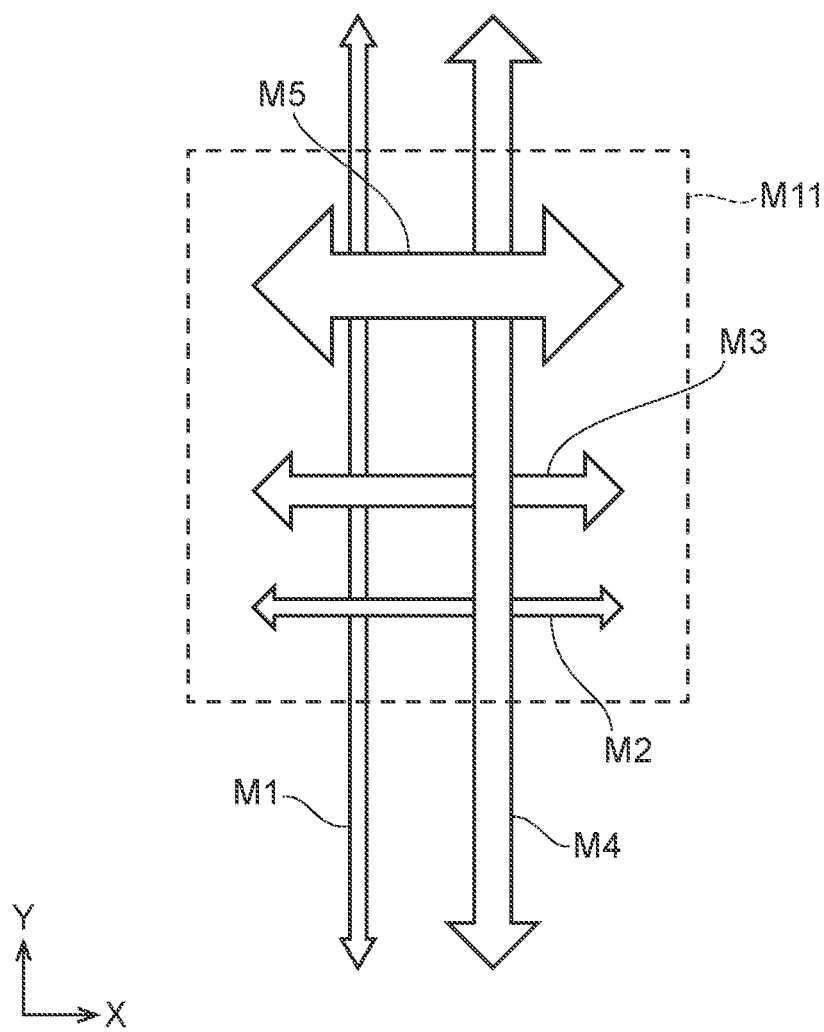
FIG. 4 is a schematic diagram for explaining extending directions of wiring patterns included in each wiring layer.

As shown in FIG. 2, a plurality of iRDLs extending in the Y direction are placed above the memory cell mats. FIG. 2 shows iRDLs 21 to 23 supplying the array potential VARY and iRDLs 31 to 33 supplying the ground potential VSS. The iRDLs 21 to 23 supplying the array potential VARY and the iRDLs 31 to 33 supplying the ground potential VSS are arranged alternately in the X direction. The iRDLs are formed in a top wiring layer where external terminals (pad electrodes) are formed. A plurality of wiring layers shown in FIG. 4 are provided between the memory cell mats and the iRDLs. In an example shown in FIG. 4, wiring layers M1 to M5 are provided on the memory cell mat M11. The wiring layer M1 is a wiring layer positioned in a lowermost layer and extends mainly in the Y direction. The wiring layer M2 is a wiring layer positioned above the wiring layer M1 and extends mainly in the X direction. The wiring layer M3 is a wiring layer positioned above the wiring layer M2 and extends mainly in the X direction. The wiring layer M4 is a wiring layer positioned above the wiring layer M3 and extends mainly in the Y direction. The wiring layer M5 is a wiring layer positioned above the wiring layer M4 and extends mainly in the X direction. The wiring layer from which the iRDLs are formed and the wiring layers M1 to M5 may be included in a multilevel wiring layers, with the iRDLs formed in the top wiring layer of the multilevel wiring layers. The widths and thicknesses of lines provided on the wiring layers M1 to M5 may be larger in upper layers. The iRDLs are positioned in a layer higher than (e.g., above) the wiring layer M5 and the line widths and line thicknesses thereof are significantly larger than those of the wiring layer M5. In embodiments of the disclosure where the iRDLs are formed in the top wiring layer of the multilevel wiring layers, the wiring layer M5 may be a second top layer that is lower by one than the top wiring layer of the multilevel wiring layers.

The iRDLs and the wiring layer M5 are coupled by via-conductors (vias) V11 to V14, V21 to V24, V31 to V34, V41 to V44, and V51 to V54 shown in FIG. 2. As shown in FIG. 2, the number of via-conductors coupling the iRDLs to the wiring layer M5 is limited to one for each memory cell mat in the present embodiment. The diameter of the via-conductors coupling the iRDLs to the wiring layer M5 is significantly larger than via-conductors coupling lower wiring layers, for example, the wiring layer M5 and the wiring layer M4 to each other. If a plurality of via-conductors coupling the iRDLs to the wiring layer M5 are allocated to one memory cell mat, a need to form a plurality of large-area patterns being in contact with the via-conductors in the wiring layer M5 arises, which leads to difficulty in densely placing other wiring patterns in the wiring layer M5. For this reason, the number of via-conductors coupling the iRDL to the wiring layer M5 is limited to one for each memory cell mat in the present embodiment. As shown in FIG. 2, the via-conductors V11 to V14 are respectively allocated to the memory cell mats M11 to M14 constituting the memory mat line L1. The via-conductors V21 to V24 are respectively allocated to the memory cell mats M21 to M24 constituting the memory mat line L2. The via-conductors V31 to V34 are respectively allocated to the memory cell mats M31 to M34 constituting the memory mat line L3. The via-conductors V41 to V44 are respectively allocated to the memory cell mats M41 to M44 constituting the memory mat line L4. The via-conductors V51 to V54 are respectively allocated to the memory cell mats M51 to M54 constituting the memory mat line L5.

As shown in FIG. 2, each of the iRDLs 21 to 23 and 31 to 33 has a wavy shape. The iRDL 21 supplying the array potential VARY is connected to the via-conductors V11, V22, V13, and V24 respectively allocated to the memory cell mats M11, M22, M13, and M24. The iRDL 22 supplying the array potential VARY is connected to the via-conductors V31, V42, V33, and V44 respectively allocated to the memory cell mats M31, M42, M33, and M44. The iRDL 23 supplying the array potential VARY is connected to the via-conductors V51 and V53 respectively allocated to the memory cell mats M51 and M53. Meanwhile, the iRDL 31 supplying the ground potential VSS is connected to the via-conductors V12 and V14 respectively allocated to the memory cell mats M12 and M14. The iRDL 32 supplying the ground potential VSS is connected to the via-conductors V21, V32, V23, and V34 respectively allocated to the memory cell mats M21, M32, M23, and M34. The iRDL 33 supplying the ground potential VSS is connected to the via-conductors V41, V52, V43, and V54 respectively allocated to the memory cell mats M41, M52, M43, and M54. In this way, the via-conductors supplying the array potential VARY and the via-conductors supplying the ground potential VSS are allocated alternately in the Y direction to the memory cell mats constituting each of the memory mat lines L1 to L5. In other words, the via-conductors supplying the array potential VARY are allocated to even numbered memory cell mats in the Y direction out of a plurality of memory cell mats constituting the memory mat lines L2 and L4 and the via-conductors supplying the ground potential VSS are allocated to odd numbered memory cell mats in the Y direction, respectively. The via-conductors supplying the array potential VARY are allocated to odd numbered memory cell mats in the Y direction out of a plurality of memory cell mats constituting the memory mat lines L1, L3, and L5 and the via-conductors supplying the ground potential VSS are allocated to even numbered memory cell mats in the Y direction, respectively.

Figure 5:
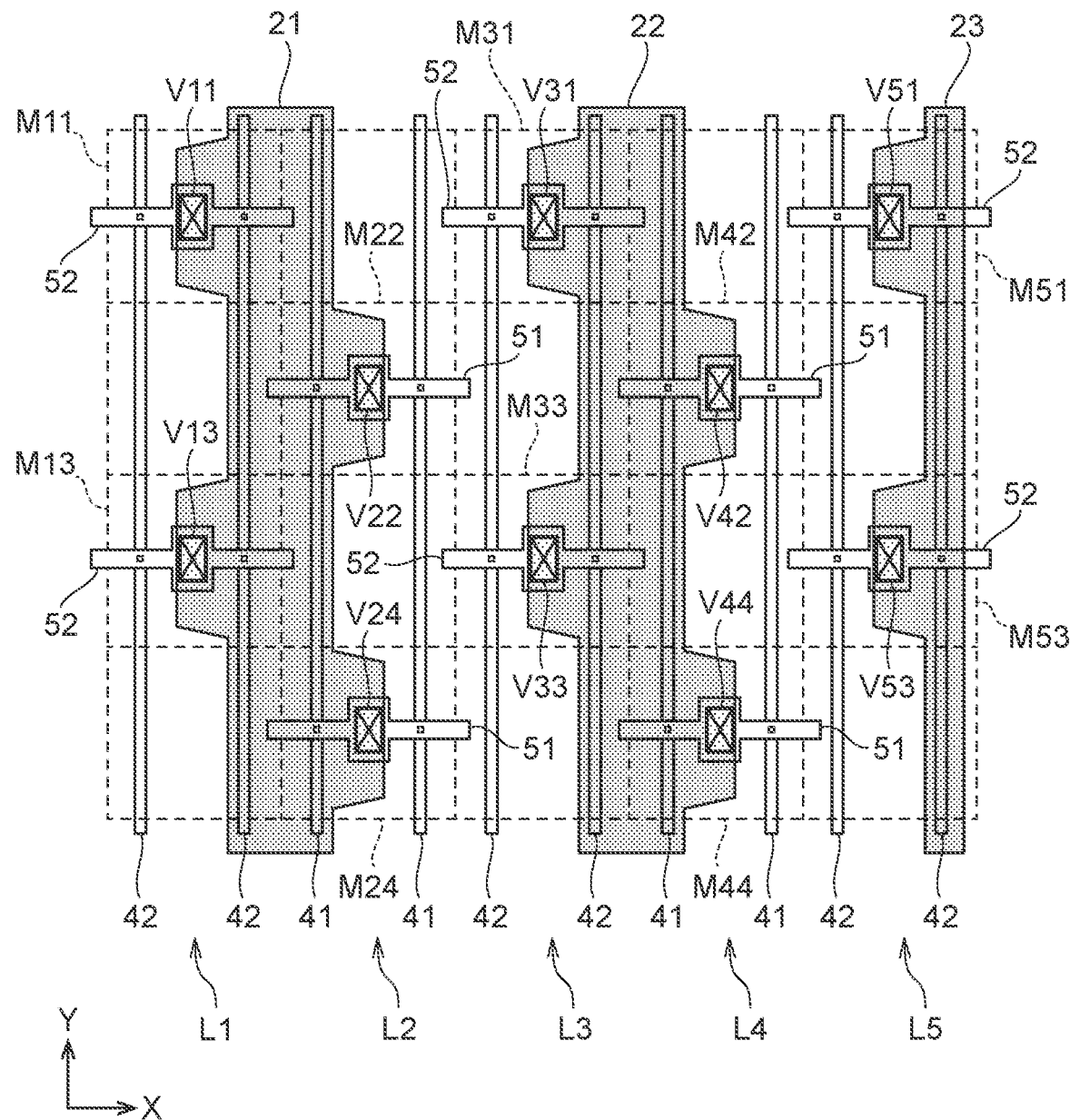
FIG. 5 is a schematic diagram showing lines supplying an array potential to memory cell mats in an extracted manner.

FIG. 5 is a schematic diagram showing lines supplying the array potential VARY to memory cell mats in an extracted manner. As shown in FIG. 5, the iRDL 21 overlaps with the memory cell mats M11 to M14 and M21 to M24 constituting the memory mat lines L1 and L2. The iRDL 22 overlaps with the memory cell mats M31 to M34 and M41 to M44 constituting the memory mat lines L3 and L4. The iRDL 23 overlaps with the memory cell mats M51 to M54 constituting the memory mat lines L5. These iRDLs 21 to 23 are coupled to power supply lines 51 and 52 positioned in the wiring layer M5 by associated via-conductors, respectively. The iRDLs 21 to 23 extend in the Y direction while meandering in the X direction. The via-conductors V22, V24, V42, and V44 provided in portions meandered to the right (in a +X direction) in FIG. 5 are coupled to the power supply line 51, and the via-conductors V11, V13, V31, V33, V51, and V53 provided in portions meandered to the left (in a -X direction) in FIG. 5 are coupled to the power supply line 52. The power supply line 51 and the power supply lie 52 may be short-circuited by any of conductor layers. The power supply lines 51 and 52 both extend in the X direction, so that the array potential VARY is supplied via the power supply lines 51 and 52 extending in the X direction to memory cell mats to which any via-conductors supplying the array potential VARY are not allocated. For example, the power supply line 51 coupled to the via-conductor V22 extends to both sides in the X direction, so that the array potential VARY is supplied to the memory cell mats M12 and M32 adjacent in the X direction. The power supply line 52 coupled to the via-conductor V33 extends to both sides in the X direction, so that the array potential VARY is supplied to the memory cell mats M23 and M43 adjacent in the X direction.

Furthermore, the power supply lines 51 and 52 are coupled to power supply lines 41 and 42 positioned in the wiring layer M4, respectively. The power supply line 41 and the power supply line 42 may be short-circuited by any of conductor layers. In some embodiments of the disclosure, the power supply line 51 may be coupled to both the power supply lines 41 and 42, and the power supply line 52 may be coupled to both the power supply lines 41 and 42, for example, by further extending the power supply line 51 and/or power supply line 52 in the X-direction. The power supply lines 41 and 42 are wiring patterns extending in the Y direction. Accordingly, the array potential VARY is supplied to memory cell mats to which any via-conductors supplying the array potential VARY are not allocated, for example, to the memory cell mat M23 from the memory cell mats M22 and M24 adjacent in the Y direction via the power supply line 41, and the array potential VARY is supplied to the memory cell mat M32 from the memory cell mats M31 and M33 adjacent in the Y direction via the power supply line 42.

Figure 6:
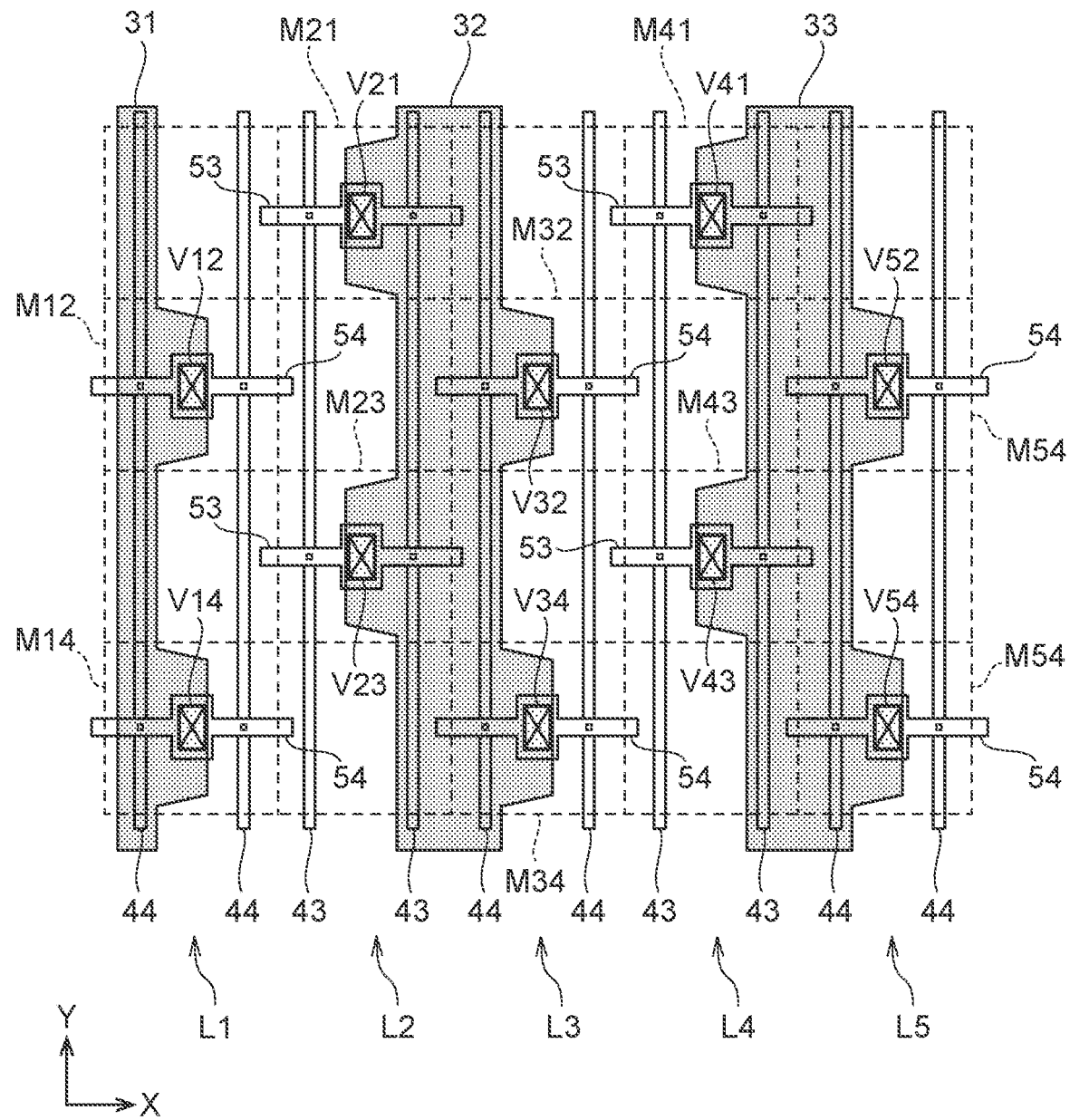
FIG. 6 is a schematic diagram showing lines supplying a ground potential to memory cell mats in an extracted manner.

FIG. 6 is a schematic diagram showing lines supplying the ground potential VSS to memory cell mats in an extracted manner. As shown in FIG. 6, the iRDL 31 overlaps with the memory cell mats M11 to M14 constituting the memory mat line L1. The iRDL 32 overlaps with the memory cell mats M21 to M24 and M31 to M34 constituting the memory mat lines L2 and L3. The iRDL 33 overlaps with the memory cell mats M41 to M44 and M51 to M54 constituting the memory mat lines L4 and L5. These iRDLs 31 to 33 are coupled to power supply lines 53 and 54 positioned in the wiring layer M5 by associated via-conductors, respectively. The iRDLs 31 to 33 extend in the Y direction while meandering in the X direction. The via-conductors V21, V23, V41, and V43 provided in portions meandered to the left (in the −X direction) in FIG. 6 are coupled to the power supply line 53, and the via-conductors V12, V14, V32, V34, V52, and V54 provided in portions meandered to the right (in the +X direction) in FIG. 6 are coupled to the power supply line 54. The power supply line 53 and the power supply lie 54 may be short-circuited by any of conductor layers. The power supply lines 53 and 54 both extend in the X direction, so that the ground potential VSS is supplied via the power supply lines 53 and 54 extending in the X direction to memory cell mats to which any via-conductors supplying the ground potential VSS are not allocated. For example, the power supply line 53 coupled to the via-conductor V23 extends to both sides in the X direction, so that the ground potential VSS is supplied to the memory cell mats M13 and M33 adjacent in the X direction. The power supply line 54 coupled to the via-conductor V32 extends to both sides in the X direction, so that the ground potential VSS is supplied to the memory cell mats M22 and M42 adjacent in the X direction.

Furthermore, the power supply lines 53 and 54 are coupled to power supply lines 43 and 44 positioned in the wiring layer M4, respectively. The power supply line 43 and the power supply line 44 may be short-circuited by any of conductor layers. In some embodiments of the disclosure, the power supply line 53 may be coupled to both the power supply lines 43 and 44, and the power supply line 54 may be coupled to both the power supply lines 43 and 44, for example, by further extending the power supply line 51 and/or power supply line 52 in the X-direction. The power supply lines 43 and 44 are wiring patterns extending in the Y direction. Accordingly, the ground potential VSS is supplied to memory cell mats to which any via-conductors supplying the ground potential VSS are not allocated, for example, to the memory cell mat M22 from the memory cell mats M21 and M23 adjacent in the Y direction via the power supply line 43, and the ground potential VSS is supplied to the memory cell mat M33 from the memory cell mats M32 and M34 adjacent in the Y direction via the power supply line 44.

As described above, only one via-conductor coupling iRDLs and the wiring layer M5 is allocated to each of the memory cell mats. However, the semiconductor memory device according to the present disclosure is supplied with power that is not directly supplied through a via-conductor, but is supplied via the wiring layer M4 or M5 from memory cell mats adjacent on both sides in the X direction and memory cell mats adjacent on both sides in the Y direction. Therefore, the array potential VARY and the ground potential VSS in each of the memory cell mats can be more stabilized.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a memory cell array including a plurality of first memory cell mats arranged in a first direction;
a first voltage line supplied with a first voltage, the first voltage line extending in the first direction and being connected to a plurality of first vias each arranged over a corresponding one of even numbered ones of the plurality of first memory cell mats; and
a second voltage line supplied with a second voltage different from the first voltage, the second voltage line extending in the first direction and being connected to a plurality of second vias each arranged over a corresponding one of odd numbered ones of the plurality of first memory cell mats, wherein the even numbered ones of the plurality of first memory cell mats and the odd numbered ones of the plurality of first memory cell mats are arranged alternately in the first direction, wherein the first voltage line does not have any vias over the odd numbered ones of the plurality of first memory cell mats, and the second voltage line does not have any vias over the even numbered ones of the plurality of first memory cell mats.

2. The apparatus of claim 1, wherein each of the first and second voltage lines has a wavy shape.

3. The apparatus of claim 1,
wherein each of the plurality memory cell mats includes a plurality of bit lines, and
wherein each of the plurality of bit lines are brought into one of the first and second voltages by a corresponding sense amplifier.

4. An apparatus comprising:
a memory cell array including a plurality of first memory cell mats arranged in a first direction;
a first voltage line supplied with a first voltage, the first voltage line extending in the first direction and being connected to a plurality of first vias each arranged over a corresponding one of even numbered ones of the plurality of first memory cell mats; and
a second voltage line supplied with a second voltage different from the first voltage, the second voltage line extending in the first diretion and being connected to a plurality of second vias each arranged over a corresponding one of odd numbered ones of the plurality of first memory cell mats, wherein the first voltage line does not have any vias over the odd numbered ones of the plurality of first memory cell mats, and the second voltage line does not have any vias over the even numbered ones of the plurality of first memory cell mats,
wherein the memory cell array includes a plurality of second memory cell mats arranged in the first direction, and
wherein the first voltage line is connected to a plurality of third vias each arranged over a corresponding one of odd numbered ones of the plurality of second memory cell mats.

5. The apparatus of claim 4, wherein each of the odd numbered ones of the plurality of first memory cell mats and a corresponding one of the odd numbered ones of the plurality of second memory cell mats are arranged in a second direction perpendicular to the first direction.

6. The apparatus of claim 5, further comprising a third voltage line suppplied with the second voltage, the third voltage line extending in the first direction and being connected to a plurality of fourth vias each arranged over a corresponding one of even numbered ones of the plurality of second memory cell mats.

7. The apparatus of claim 6, wherein each of the even numbered ones of the plurality of first memory cell mats and a corresponding one of the even numbered ones of the plurality of second memory cell mats are arranged in the second direction.

8. The apparatus of claim 7, wherein the first voltage line does not have any vias over the even numbered ones of the plurality of second memory cell mats, and the third voltage line does not have any vias over the odd numbered ones of the plurality of second memory cell mats.

9. The apparatus of claim 8, wherein the first, second, and third voltage lines are arranged on a top wiring layer of a multilevel wiring layers.

10. The apparatus of claim 9, wherein the top wiring layer is an iRDL (inline redistribution layer).

11. The apparatus of claim 10, furt ero mprising
a plurality of fifth voltage lines extending in the second direction, each of the plurality of fifth voltage line being coupled to an associated one of the plurality of first vias;
a plurality of sixth voltage lines extending in the second direction, each of the plurality of sixth voltage lines being coupled to an associated one of the plurality of second vias;
a plurality of seventh voltage lines extending in the second direction, each of the plurality of seventh voltage lines being coupled to an assocaited one of the plurality of third vias; and
a plurality of eighth voltage lines extending in the second direction, each of the plurality of eighth voltage lines being coupled to an associated one of the plurality of fourth vias.

12. The apparatus of claim 11,
wherein each of the even numbered ones of the plurality of second memory cell mats is supplied with the first voltage via an associated one of the plurality of fifth voltage lines,
wherein each of the odd numbered ones of the plurality of second memory cell mats is supplied with the second voltage via an associated one of the plurality of sixth voltage lines,
wherein each of the odd numbered ones of the plurality of first memory cell mats is supplied with the first voltage via an associated one of the plurality of seventh voltage lines, and
wherein each of the even numbered ones of the plurality of first memory cell mats is supplied with the second voltage via an associated one of the plurality of eighth voltage lines.

13. The apparatus of claim 12, wherein the fifth, sixth, seventh, and eighth voltage lines are in a $2^{nd}$ top layer which is lower by one than the top wiring layer of the nmultilevel wiring layers.

14. The apparatus of claim 13, further comprising:
a plurality of ninth voltage lines extending in the first direction, each of the plurality of ninth voltage lines being coupled to an associated one of the plurality of fifth voltage lines;

a plurality of tenth voltage lines extending in the first direction, each of the plurality of tenth voltage lines being coupled to an associated one of the plurality of sixth voltage lines;
a plurality of eleventh voltage lines extending in the first direction, each of the plurality of eleventh voltage lines being coupled to an associated one of the plurality of seventh voltage lines; and
a plurality of twelfth voltage lines extending in the first direction, each of the plurality of twelfth voltage lines being coupled to an associated one of the plurality of eighth voltage lines.

15. The apparatus of claim 14,
wherein each of the odd numbered ones of the plurality of first memory cell mats is supplied with the first voltage further via an associated one of the plurality of ninth voltage lines,
wherein each of the even numbered ones of the plurality of first memory cell mats is supplied with the second voltage further via an associated one of the plurality of tenth voltage lines,
wherein each of the even numbered ones of the plurality of second memory cell mats is supplied with the second voltage further via an associated one of the plurality of eleventh voltage lines, and
wherein each of the odd numbered ones of the plurality of second memory cell mats is supplied with second voltage further via a associated one of the plurality of twelfth voltage lines.

16. An apparatus comprising:
first, second, third, and fourth regions, the first and second circuit regions being arranged in a first direction, the third and fourth circuit regions arranged in the first direction, the first and third circuit regions being arranged in a second direction perpendicular to the first direction, and the second and fourth circuit regions being arranged in he second direction;
a first iRDL (inline redistribution layer) supplied with a first voltage, the first iRDL extending in the first direction and overlapping the first, second, third, and fourth circuit regions;
a second iRDL supplied with a second voltage different from the first voltage, the second iRDL extending in the first direction and overlapping the first and second circuit regions without overlapping the third and fourth circuit regions;
a third iRDL supplied with the second voltage, the third iRDL extending in the first direction and overlapping the third and fourth circuit regions without overlapping the first and second circuit regions;
a first voltage line coupled to the first iRDL by a first via-conductor arranged above the first circuit region, the first voltage line extending in the second direction and overlapping the first and third circuit regions to supply the first voltage to the first and third circuit regions;
a second voltage line coupled second iRDL by a second via-conductor arranged above the second circuit region, the second voltage line extending in the second direction and overlapping the second and fourth circuit regions supply the second voltage to the second and fourth circuit regions;
a third voltage line coupled to the third iRDL by a third via-conductor arranged above the third circuit region, the third voltage line extending in the second direction and overlapping the first and third circuit regions to supply the second voltage to the first and third circuit regions;

a fourth voltage line coupled to the first iRDL by a fourth via-conductor arranged above the fourth circuit region, the fourth voltage line extending in the second direction and overlapping the second and fourth circuit regions to supply the first voltage to the second and fourth circuit regions.

17. The apparatus of claim 16,
wherein the first, second, third, and fourth iRDLs are in a top wiring layer of a multilevel wiring layers, and
wherein the first, second, third, and fourth voltage lines are in a $2^{nd}$ top layer which is lower by one than the top wiring layer of the multilevel wiring layers.

18. The apparatus of claim 16, further comprising:
a fifth voltage line coupled to the first voltage line, the fifth voltage line extending in the first direction and overlapping the first and second circuit regions to supply the first voltage to the first and second circuit regions;
a sixth voltage line coupled to the second voltage line, the sixth voltage line extending in the first direction and overlapping the first and second circuit regions to supply the second voltage to the first and second circuit regions;
a seventh voltage line coupled to the third voltage line, the seventh voltage line extending in the first direction and overlapping the third and fourth circuit regions to supply the second voltage to the third and fourth circuit regions; and
an eighth voltage line coupled to the fourth voltage line, the eighth voltage line extending in the first direction and overlapping the third and fourth circuit regions to supply the first voltage to the third and fourth circuit regions.

19. An apparat comprising:
a plurality of memory cell mats including first and second memory cell mats arranged in a first direction;
a first iRDL supplied with a first voltage, the first iRDL extending in the first direction and being coupled to a first via-conductor arranged over the first memory cell mat;
a second iRDL supplied with a second voltage different from the first voltage, the second iRDL extending in the first direction and being coupled to a second via-conductor arranged over the second memory cell mat;
a first voltage line coupled to the first via-conductor, the first voltage line extending in the first direction supply the first voltage to the first and second memory cell mats; and
second voltage line coupled to the second via-conductor, the second voltage line extending in the first direction to supply the second voltage to the first and second memory cell mats,
wherein the first iRDL overlaps with the first memory cell mat and the second memory cell mat,
wherein the first iRDL does not have any via-conductors over the second memory cell mat,
wherein the second iRDL overlaps with the first memory cell mat and the second memory cell mat,
wherein the second iRDL does not have any via-conductors over the first meniory cell mat,
wherem each of the first and second memory cell mats includes a plurality of bit lines, and
wherein each of the plurality of bit lines are brought into one of the first and second voltages by a corresponding sense amplifier.

* * * * *